United States Patent
Jonoshita et al.

(10) Patent No.: US 7,288,345 B2
(45) Date of Patent: Oct. 30, 2007

(54) PHOTOSENSITIVE COLORED COMPOSITION AND COLOR FILTER

(75) Inventors: Yukiyoshi Jonoshita, Tokyo (JP); Tadashi Tanoue, Tokyo (JP); Takeshi Itoi, Tokyo (JP); Mizuhiro Tani, Tokyo (JP)

(73) Assignees: Toyo Ink Mfg. Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 296 days.

(21) Appl. No.: 11/094,225

(22) Filed: Mar. 31, 2005

(65) Prior Publication Data

US 2006/0222969 A1    Oct. 5, 2006

(51) Int. Cl.
*G03F 7/033* (2006.01)
*G03F 1/10* (2006.01)
*G03F 7/105* (2006.01)

(52) U.S. Cl. .................. 430/7; 430/281.1; 430/287.1; 430/910

(58) Field of Classification Search ............... 430/7, 430/281.1, 287.1, 910
See application file for complete search history.

(56) References Cited

U.S. PATENT DOCUMENTS

| 2,855,403 A | 10/1958 | McKellin et al. |
| 5,800,952 A * | 9/1998 | Urano et al. ............... 430/7 |

| 2002/0076652 A1 * | 6/2002 | Kumazawa et al. ..... 430/284.1 |

FOREIGN PATENT DOCUMENTS

| JP | 5-39450 | 2/1883 |
| JP | 41-2466 | 2/1966 |
| JP | 62-25164 | 6/1987 |
| JP | 63-305173 | 12/1988 |
| JP | 1-247468 | 10/1989 |
| JP | 3-26767 | 2/1991 |
| JP | 4-223468 | 8/1992 |
| JP | 9-178932 | 7/1997 |
| JP | 10-111573 | 4/1998 |

* cited by examiner

Primary Examiner—Richard L. Schilling
(74) Attorney, Agent, or Firm—Nixon & Vanderhye P.C.

(57) ABSTRACT

A photosensitive colored composition contains a resin, a monomer and a colorant. The resin is a copolymer resin of at least one compound (a) represented by general formula (I) below with at least one other compound (b) having an ethylenically unsaturated double bond:

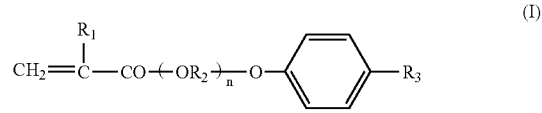

(I)

where $R_1$ represents H or $CH_3$, $R_2$ represents an alkylene group having 2 or 3 carbon atoms, $R_3$ represents a hydrogen atom or an alkyl group having 1 to 20 carbon atoms which may contain a benzene ring, and n is an integer of 1 to 15.

9 Claims, No Drawings

PHOTOSENSITIVE COLORED COMPOSITION AND COLOR FILTER

BACKGROUND OF THE INVENTION

1. Field of the Invention

The invention relates to a novel photosensitive colored composition and a color filter. A photosensitive colored composition according to the invention is suitably used for image-forming materials such as optical color filters and solder resists. In particular, the present invention relates to a photosensitive colored composition that is suitably used for preparing color filters for use in color liquid crystal displays, color image tube devices and the like, and to a color filter using the same.

2. Description of the Related Art

Color filters for use in, e.g., color liquid crystal displays, and color image tube devices are produced by forming two or more colored images different in color tone in the fine stripe, mosaic, or other pattern on a transparent substrate such as a glass substrate. The pattern width varies according to the applications of the color filter, but is usually approximately 5 to 700 μm. In addition, the accuracy of position in superimposing the patterns is several to dozens μm, and thus color filters are produced by using microfabrication technology superior in dimensional accuracy.

Methods of producing color filters include dyeing, electrodeposition, printing, and pigment dispersion, but considering the productivity, quality, cost, and others together, the pigment dispersion method is most favorable and thus has been used widely as the method of producing color filters. The pigment dispersion method is a method of producing a color filter by forming a colored image on a substrate with a color resist formed of a colored photosensitive resin composition containing an organic pigment dispersed therein by photolithography.

However, in the pigment dispersion method, it has been difficult to stably disperse pigments and in particular to select a suitable dispersing resin, which has a significant influence on the dispersion stability of pigments.

The color resist is generally applied onto a glass substrate by using a spin coater, but if the fluidity of the pigment is insufficient, it is difficult to obtain a uniform coated film.

The viscosity of color resists, or pigment dispersions, is known to depend generally on shear rate. Because the thickness of the color resist film obtained by spin coating is proportional to the viscosity of the color resist, the viscosity of the color resist when applied should be kept the same in the central and outer surface areas of the transparent substrate for production of a uniform coated film.

When a color resist is dispensed and rotated on a substrate, the apparent viscosity of the color resist in the central area is close to the viscosity when the shear rate is lower, because the color resist has a lower linear centrifugal velocity there. On the contrary, the apparent viscosity of the color resist in the outer peripheral area on the substrate is close to the viscosity when the shear rate is higher, because the color resist has a higher linear velocity there. As a result, the color resist, which is thixotropic in nature, provides a film greater in thickness in the central area on the substrate where the shear rate is lower and the apparent viscosity is higher, and thinner in thickness in the outer peripheral area on the substrate where the shear rate is higher and the apparent viscosity is lower. Because a color filter should have a uniform film thickness all over the substrate, a color resist for production of the color filter should be a fluid having a uniform viscosity independent of the shear rate, i.e., a Newtonian fluid.

As color filters demand a particularly high transparency, dispersions containing very fine pigment particles dispersed uniformly in transparent vehicles have been used.

It is known to be difficult to obtain a stabilized dispersion by dispersing fine pigment particles in vehicles, causing various problems in production and of the quality of the resulting products. For example, a dispersion containing fine pigment particles often shows a high viscosity, making it difficult to discharge the product dispersion from a dispersing machine and to transport the product and, to make matters worse, making itself unusable due to gelation during storage. It may also cause the troubles of deterioration in transparency of the color resist-coated film, leveling defects, and the like. Accordingly, there exists a need for a method of dispersing a finer pigment in a more stabilized manner, for production of color filters superior in transparency by the pigment dispersion method.

In addition, pigment particles in a color resist often coagulate gradually over time, raising the viscosity and enhancing the thixotropic property of the dispersion. Thus, when the color resists are coated by a spin coater, color resists immediately after production and after storage for a certain period of time provide coated films different in thickness and uniformity.

For these reasons, it is quite important that the color resist is a Newtonian fluid and retains its physical properties unchanged for an extended period of time.

Color resists are sometimes coated by a coater other than the spin coater, such as a slit & spin coater, a roll coater, or a curtain coater. The color resists are supplied to nozzles, slit dies, and the like from their chemicals tanks via piping made of, for example, polytetrafluoroethylene, polypropylene, or the like and air-operated valves.

When a conventional photosensitive colored composition is coated by the coater noted above, insoluble aggregates accumulate in the piping made of, for example, polytetrafluoroethylene, polypropylene, or the like, inside of air-operated valves, dispense nozzles, the tips of slit dies, and the like because of its low dispersion stability of pigment, resulting in the foreign-matter defects of the color filter caused by the aggregates and thus drastic decrease in productivity.

To overcome the various problems above, methods of using a pigment derivative having an organic pigment as a skeleton and an acidic or basic substituent group as a dispersant have been proposed (see, for example, Jpn. Pat. Appln. KOKOKU Publication No. 41-2466, U.S. Pat. No. 2,855,403, and Jpn. Pat. Appln. KOKAI Publication Nos. 63-305173, 1-247468, and 3-26767).

In addition, use of a copolymer having an alkyleneoxy group has been also proposed (see, for example, Jpn. Pat. Appln. KOKOKU Publication No. 62-25164, and Jpn. Pat. Appln. KOKAI Publication Nos. 4-223468 and 5-39450).

However, it is still difficult to obtain satisfactory effects even by use of these methods, although there are some exceptions.

BRIEF SUMMARY OF THE INVENTION

Therefore, an object of the present invention is to provide a photosensitive colored composition superior in the dispersion stability of pigment.

Another object of the invention is to provide a color filter using the photosensitive colored composition.

The present invention provides a photosensitive colored composition comprising a resin, a monomer and a colorant, wherein the resin is a copolymer resin of at least one compound (a) represented by the following general formula (I) with at least one other compound (b) having an ethylenically unsaturated double bond:

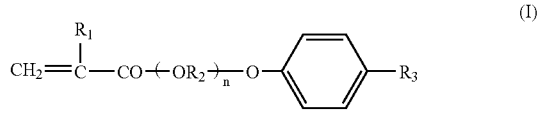

where $R_1$ represents H or $CH_3$; $R_2$ represents an alkylene group having 2 or 3 carbon atoms; $R_3$ represents a hydrogen atom or an alkyl group having 1 to 20 carbon atoms which may contain a benzene ring; and n is an integer of 1 to 15.

The present invention also provides a color filter comprising a transparent substrate and a colored layer formed on the transparent substrate by using a photosensitive colored composition according to the invention.

DETAILED DESCRIPTION OF THE INVENTION

The invention will be described in more detail below.

A photosensitive colored composition according to the present invention contains a copolymer resin of a compound (a) represented by the above general formula (I) and another compound (b) having an ethylenically unsaturated double bond. The resin (copolymer) plays roles of preventing aggregation of colorant (pigment) particles contained in the photosensitive colored composition according to the invention and ensuring uniform dispersion of the fine pigment particles, and thus is important in producing color filters higher in light transmittance and superior in color purity.

The compound (a) represented by general formula (I), which is a constituent component of the resin, has better adsorption and orientation properties onto a pigment surface because of the effect of π-electrons of the benzene ring present therein.

In general formula (I), the alkylene group $R_2$ has 2 or 3 carbon atoms. The alkyl group $R_3$ has 1 to 20 carbon atoms and more preferably 1 to 10 carbon atoms. When the number of carbons is 1 to 10, the alkyl group $R_3$ inhibits aggregation, i.e., approach of resin molecules to each other, by steric hindrance of the alkyl group and thus promotes adsorption and orientation onto the pigment. When the number of carbons in the alkyl group $R_3$ is greater than 10, the steric hindrance of the alkyl group becomes so large that the alkyl group even inhibits adsorption/orientation, onto the pigment, of the benzene ring to which the alkyl group is connected. This tendency become more apparent when the carbon-chain length of the alkyl group $R_3$ becomes greater, and when the number of carbons is more than 20, the adsorption/orientation of the benzene ring to which the alkyl group is connected become still more lower. Examples of the alkyl groups represented by $R_3$ containing a benzene ring include a benzyl group, and a 2-phenyl(iso)propyl group.

Examples of the compound (a) include phenol ethylene oxide (EO)-modified (meth)acrylates, p-cumylphenol EO- or propylene oxide (PO)-modified (meth)acrylates, nonylphenol EO-modified (meth)acrylates, and nonylphenol PO-modified (meth)acrylates. The compound (a) may be used singly or in combination of two or more. Among these compounds, p-cumylphenol EO- or PO-modified (meth)acrylates is more favorable, as they provide a surface more favorable in adsorption and orientation onto the pigment, not only by the effect of π-electrons of the benzene ring but also by its steric effect.

The compound (b) is a compound different from the compound (a), even though it has an ethylenically unsaturated double bond. Examples of the compound (b) include (meth)acrylic acid, methyl(meth)acrylate, ethyl(meth)acrylate, (iso)propyl(meth)acrylate, (iso)butyl(meth)acrylate, (iso)pentyl(meth)acrylate, 2-hydroxyethyl(meth)acrylate, 2-hydroxypropyl(meth)acrylate, benzyl(meth)acrylate, cyclohexyl(meth)acrylate, glycidyl(meth)acrylate, isobonyl (meth)acrylate, acid phosphoxyethyl(meth)acrylate, acid phosphoxypropyl(meth)acrylate, 3-chloro-2-acid phosphoxyethyl(meth)acrylate, and acid phosphoxy-polyethylene glycol mono(meth)acrylate. The compound (b) may be used singly or in combination of two or more.

A content of the compound (a) in the resin according to the invention is 0.1 to 50% by weight and more preferably 10 to 35% by weight. A content of the compound (a) of less than 10% by weight may lead to deterioration in the dispersion efficiency of pigment, while a content of less than 0.1% by weight may lead to an insufficient dispersion efficiency of the pigment. On the other hand, a content of more than 35% by weight leads to increase in hydrophobicity and consequently to deterioration in the developing efficiency of resulting photosensitive colored compositions and increase in the amount of residues. Further, a content of more than 50% by weight leads to drastic decrease in compatibility with other constituent components in the photosensitive colored composition, often resulting in precipitation of the monomers and the photopolymerization initiator therein.

The weight-average molecular weight (Mw) of the resin (copolymer) according to the invention is preferably 5,000 to 100,000 and more preferably 10,000 to 50,000.

Use of (meth)acrylic acid ester containing a phosphate group such as acid phosphoxyethyl(meth)acrylate, acid phosphoxypropyl(meth)acrylate, 3-chloro-2-acid phosphoxyethyl(meth)acrylate, or acid phosphoxy-polyethylene glycol mono(meth)acrylate as the compound (b) often leads to further improvement in the dispersion efficiency of pigment.

The content of the phosphate group-containing (meth)acrylic acid ester is preferably 0.05 to 10% by weight and more preferably 0.1 to 5% by weight. When the content of the phosphate group-containing (meth)acrylic acid ester is less than 0.05% by weight, it is not possible to obtain a sufficiently high dispersion efficiency of pigment. On the other hand, a content of more than 10% by weight leads to increase in resin polarity and consequently to drastic increase in developing speed, decrease in compatibility with other hydrophobic components, and precipitation of the resin.

Further, an ethylenic double bond may be introduced onto the side chain of the resin (copolymer) according to the invention to facilitate the reactions between monomers or resins and to improve the sensitivity of the photosensitive colored composition. Specifically, if the resin has a reactive functional group, for example, a hydroxyl group, it is possible to introduce an ethylenic double bond on the side chain of the resin by the reaction with a compound having a functional group reactive with the functional group noted above and an ethylenically unsaturated group, such as glycidyl (meth)acrylate or 2-(meth)acryloyloxy isocyanate.

The copolymer according to the invention can be produced by radical polymerization of the compounds (a) and (b) at 50 to 150° C. in the presence of a radical polymerization initiator under inert gas flow for 2 to 10 hours. The polymerization reaction may be carried out in the presence of a solvent as needed.

Examples of the radical polymerization initiator include organic peroxides such as benzoyl peroxide, cumene hydroperoxide, t-butyl hydroperoxide, diisopropyl peroxycarbonate, di-t-butyl peroxide, and t-butyl peroxybenzoate; and azo compounds such as 2,2'-azobisisobutyronitrile. The radical polymerization initiator is used in an amount preferably of 1 to 20 parts by weight with respect to 100 parts by weight of the ethylenically unsaturated monomers (i.e., the total amount of the compounds (a) and (b)).

Examples of the solvent usable in the radical polymerization reaction include water and/or water-miscible organic solvents; acetic acid esters such as ethylcellusolve acetate and propylene glycol monomethylether acetate; ketones such as cyclohexanone and methylisobutylketone; xylene, ethylbenzene, and the like. Examples of the water-miscible organic solvent include alcoholic solvents such as ethyl alcohol, isopropyl alcohol, and n-propyl alcohol; and ethylene glycol or diethyleneglycol mono- or di-alkylethers.

Since the resin according to the invention shows superior dispersion efficiency to almost all pigments, the photosensitive colored composition according to the invention having a pigment dispersed therein by using this resin provides a colored layer having a smaller amount of pigment aggregates when used for production of the colored layers of the color filter.

The resin (copolymer) according to the invention cannot be cured by irradiation of active energy ray and thus a colored composition only with the resin (copolymer) does not allow formation of the pattern of the color filter by active energy ray irradiation. However, it becomes possible to cure the colored composition by active energy ray irradiation by adding a monomer (polymerizable monomer) having a functional group (ethylenic double bond). A monomer having one functional group (ethylenic double bond) per molecule is a monofunctional monomer, while a monomer having two or more functional groups (ethylenic double bonds) per molecule is a polyfunctional monomer. A monomer having a greater number of functional groups (ethylenic double bonds) per a molecule is of course higher in reactivity. Examples of monofunctional monomers include various acrylic and methacrylic acid esters such as 2-hydroxyethyl (meth)acrylate, 2-hydroxypropyl(meth)acrylate, cyclohexyl (meth)acrylate, tricyclodecanyl(meth)acrylate, (meth) acrylic acid, styrene, vinyl acetate, (meth)acrylamide, N-hydroxymethyl(meth)acrylamide, and acrylonitrile. Examples of polyfunctional monomers include polyethylene glycol di(meth)acrylate, pentaerythritol tri(meth)acrylate, dipentaerythritol hexa(meth)acrylate, epoxy(meth)acrylate, EO-modified bisphenol A di(meth)acrylate, 1,4-butanediol di(meth)acrylate, diethylene glycol di(meth)acrylate, 1,6-hexanediol di(meth)acrylate, neopentyl glycol di(meth)acrylate, polyester(meth)acrylate, trimethyrollpropane tri(meth) acrylate, tris(acryloxyethyl)isocyanurate, tris (methacryloxyethyl)isocyanurate, dipentaerythritol penta (meth)acrylate, caprolactone-modified dipentaerythritol hexaacrylate, ditrimethylolpropane tetra(meth)acrylate, epoxy acrylate, and pentaerythritol tetra(meth)acrylate.

The pigment for use in the photosensitive colored composition according to the invention as a colorant is not particularly limited, and any one of commonly used pigments may be used. Examples of the pigments include organic pigments such as diketopyrrolopyrrole pigments, azo, disazo, and polyazo pigments, phthalocyanine pigments including copper phthalocyanine, halogenated copper phthalocyanine, non-metal phthalocyanine and the like, anthraquinone pigments including aminoanthraquinone, diaminodianthraquinone, anthrapyrimidine, fravantrone, anthanthrone, indanthron, pyranthron, violanthrone and the like, quinacridone pigments, dioxazine pigments, perynone pigments, perylene pigments, thioindigo pigments, isoindoline pigments, isoindolinone pigments, quinophtharone pigments, threne pigments, and metal complex pigments; inorganic pigments such as titanium oxide, zinc white, zinc sulfide, white lead, calcium carbonate, sedimentary barium sulfate, white carbon, alumina white, kaolin clay, talc, bentonite, iron oxide black, cadmium red, iron oxide red, molybdenum red, molybdate orange, chrome vermilion, chrome yellow, cadmium yellow, iron oxide yellow, titanium yellow, chromium oxide, viridian, titanium cobalt green, cobalt green, cobalt chromium green, Victoria green, ultramarine, iron blue, cobalt blue, cerulean blue, cobalt silica blue, cobalt zinc silica blue, manganese violet, and cobalt violet; and carbon blacks such as acetylene black, channel black, and furnace black. The pigment preferably has an average particle diameter of 0.01 to 1 μm.

The photosensitive colored composition according to the invention preferably contains the copolymer resin, the monomer, and the colorant (pigment) at a weight ratio of 1-50:1-10:1-15.

The photosensitive colored composition according to the invention preferably contains at least one derivative selected from a pigment derivative having a basic group, an anthraquinone derivative having a basic group, and a triazine derivative having a basic group, for the purpose of further improving the advantageous effects of the copolymer according to the invention.

The pigment derivative is a compound obtained by replacing a suitable number of hydrogen atoms on the skeleton of an organic pigment with a sulfonic acid, amine, sulfonamide, or other similar group; and such a derivative improves the dispersion stability of the pigment in the photosensitive colored composition by adsorption of the group on the pigment surface.

The pigment derivative having a basic group, the anthraquinone derivative, or the triazine derivative having a basic group for use in the invention has at least one substituent selected from the groups represented by the following formulae (1), (2), (3) and (4).

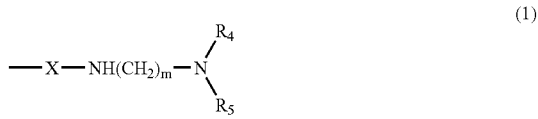

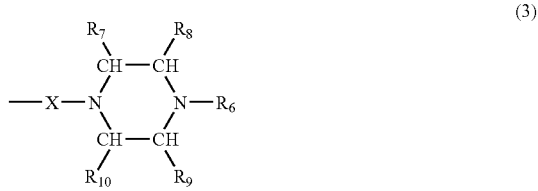

-continued

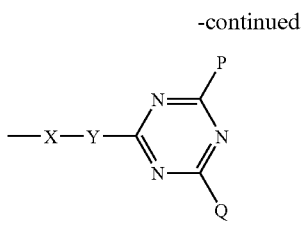

(4)

In the Formulae (1) to (4),

X represents —SO$_2$—, —CO—, —CH$_2$NHCOCH$_2$—, —CH$_2$— or a single bond;

m is an integer of 1 to 10;

R$_4$ and R$_5$ each independently represent an alkyl group that may be substituted, an alkenyl group that may be substituted, or a phenyl group that may be substituted; or R$_4$ and R$_5$ may be bonded together forming a heterocyclic ring, which may be substituted, containing an additional nitrogen, oxygen or sulfur atom. The alkyl and alkenyl groups each preferably have 1 to 10 carbon atoms;

R$_6$ represents an alkyl group that may be substituted, an alkenyl group that may be substituted, or a phenyl group that may be substituted. The alkyl and alkenyl groups each preferably have 1 to 10 carbon atoms;

R$_7$, R$_8$, R$_9$, and R$_{10}$ each independently represent a hydrogen atom, an alkyl group that may be substituted, an alkenyl group that may be substituted, or a phenyl group that may be substituted. The alkyl and alkenyl groups each preferably have 1 to 5 carbon atoms;

Y represents —NR$_{11}$—Z—NR$_{12}$— or a single bond.

R$_{11}$ and R$_{12}$ each independently represent a hydrogen atom, an alkyl group that may be substituted, an alkenyl group that may be substituted, or a phenyl group that may be substituted. The alkyl and alkenyl groups each preferably have 1 to 5 carbon atoms;

Z represents an alkylene group that may be substituted, an alkenylene group that may be substituted, or a phenylene group that may be substituted. The alkylene and alkenylene groups each preferably have 1 to 8 carbon atoms;

P represents a substituent group represented by formula (5) or (6) below; and

Q represents a hydroxyl group, an alkoxy group, a substituent group represented by formula (5) below, or a substituent group represented by formula (6) below:

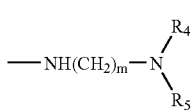

(5)

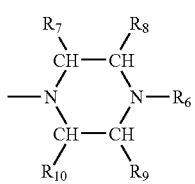

(6)

In formulae (5) and (6), R$_4$ to R$_{10}$ and m are the same as those defined above.

Examples of the amine components used for producing the substituent groups represented by Formulae (1) to (6) include dimethylamine, diethylamine, N,N-ethylisopropylamine, N,N-ethylpropylamine, N,N-methylbutylamine, N,N-methylisobutylamine, N,N-butylethylamine, N,N-tert-butylethylamine, diisopropylamine, dipropylamine, N,N-sec-butylpropylamine, dibutylamine, di-sec-butylamine, diisobutylamine, N,N-isobutyl-sec-butylamine, diamylamine, diisoamylamine, dihexylamine, di(2-ethylhexyl)amine, dioctylamine, N,N-methyloctadecylamine, didecylamine, diallyamine, N,N-ethyl-1,2-dimethylpropylamine, N,N-methylhexylamine, dioleylamine, distearylamine, N,N-dimethylaminomethylamine, N,N-dimethylaminoethylamine, N,N-dimethylaminoamylamine, N,N-dimethylaminobutylamine, N,N-diethylaminoethylamine, N,N-diethylaminopropylamine, N,N-diethylaminohexylamine, N,N-diethylaminobutylamine, N,N-diethylaminopentylamine, N,N-dipropylaminobutylamine, N,N-dibutylaminopropylamine, N,N-dibutylaminoethylamine, N,N-dibutylaminobutylamine, N,N-di(iso)butylaminopentylamine, N,N-methyl-laurylaminopropylamine, N,N-ethyl-hexylaminoethylamine, N,N-distearylaminoethylamine, N,N-dioleylaminoethylamine, N,N-distearylaminobutylamine, piperidine, 2-pipecoline, 3-pipecoline, 4-pipecoline, 2,4-lupetidine, 2,6-lupetidine, 3,5-lupetidine, 3-piperidinemethanol, pipecolic acid, isonipecotic acid, methyl isonipecotate, ethyl isonipecotate, 2-piperidineethanol, pyrrolidine, 3-hydroxypyrrolidine, N-aminoethylpiperidine, N-aminoethyl-4-pipecoline, N-aminoethylmorpholine, N-aminopropylpiperidine, N-aminopropyl-2-pipecoline, N-aminopropyl-4-pipecoline, N-aminopropylmorpholine, N-methylpiperazine, N-butylpiperazine, N-methylhomopiperazine, 1-cyclopentylpiperazine, 1-amino-4-methylpiperazine, and 1-cyclopentylpiperazine.

Examples of the organic dyestuff composing the pigment derivative having a basic group include diketopyrrolopyrrole dyestuffs, azo, disazo, and polyazo dyestuffs, phthalocyanine dyestuffs, anthraquinone dyestuffs including diaminodianthraquinone, anthrapyrimidine, fravantrone, anthanthrone, indanthron, pyranthron, violanthrone and others, quinacridone dyestuffs, dioxazine dyestuffs, perynone dyestuffs, perylene dyestuffs, thioindigo dyestuffs, isoindoline dyestuffs, isoindolinone dyestuffs, quinophtharone dyestuffs, threne dyestuffs, metal complex dyestuffs, and the like.

The anthraquinone derivative having a basic group may have a substituent, for example, an alkyl group such as methyl or ethyl, an amino group, a nitro group, a hydroxyl group, an alkoxy group such as methoxy or ethoxy, or a halogen such as chlorine.

The triazine derivative having a basic group is a 1,3,5-triazine that may be substituted with an alkyl group such as methyl or ethyl, an amino group, an alkylamino group such as dimethylamino, diethylamino, or dibutylamino, a nitro group, a hydroxyl group, an alkoxy group such as methoxy, ethoxy, or butoxy, a halogen atom such as chlorine, a phenyl group which may be substituted with a substituent such as methyl, methoxy, amino, dimethylamino, or hydroxyl, a phenylamino group which may be substituted with a substituent such as methyl, ethyl, methoxy, ethoxy, amino, dimethylamino, diethylamino, nitro, or hydroxyl, or the like.

The pigment or anthraquinone derivative having a basic group according to the invention can be prepared via a variety of synthetic routs. The derivative is produced, for example, by introducing a substituent group represented by the following formulae (7) to (10) below into an organic dyestuff or anthraquinone, and then allowing the reaction product to react with an amine component capable of forming the compounds represented by Formulae (1) to (4) by reaction with the substituent group, for example, N,N-dimethylaminopropylamine, N-methylpiperazine, diethylamine, 4-[4-hydroxy-6-[3-(dibutylamino)propylamino]-1,3,5-triazin-2-ylamino]aniline, or the like.

—SO₂Cl                             (7)

—COCl                              (8)

—CH₂NHCOCH₂Cl                 (9)

—CH₂Cl                            (10)

When the organic dyestuff is an azo dyestuff, the azo pigment derivative can be produced by introducing a substituent group represented by one of Formulae (1) to (4) into a diazo component or a coupling component and then allowing a coupling reaction to proceed.

The triazine derivative having a basic group according to the invention can be prepared via a variety of synthetic routs. The triazine derivative is produced, for example, by using a cyanuric chloride as the starting material, reacting at least one chlorine of cyanuric chloride with an amine component that forms a substituent group represented by one of Formulae (1) to (4), for example, N,N-dimethylaminopropylamine, N-methylpiperazine, or the like, and then allowing amines, alcohols, or the like to react with the remainig chlorines on the cyanuric chloride.

The pigment derivative having a basic group, the anthraquinone derivative having a basic group and/or the triazine derivative having a basic group can be used in an amount of 1 to 30 parts by weight with respect to 100 parts by weight of pigment.

In addition to the pigment derivative, the photosensitive colored composition according to the invention may further contain a pigment dispersant such as an alkylene oxide polymer.

The alkylene oxide polymer is a polymer having ethylene oxide and/or propylene oxide units in the molecule, which improves the dispersion stability of the pigment in the photosensitive colored composition and the flow properties of the photosensitive colored composition, by being adsorbed on the surface of the pigment and/or pigment dispersant due to the amphipathic property endowed by combination of its hydrophilic and hydrophobic groups. The pigment dispersant such as an alkylene oxide polymer is preferably used in an amount of 1 to 50 parts by weight with respect to 100 parts by weight of pigment.

In addition to the resins above, a general resin such as acryl resin, α-olefin/maleic acid (anhydride) copolymer, styrene/maleic acid (anhydride) copolymer, isobutylene/maleic acid (anhydride) copolymer, styrene/styrene sufonic acid copolymer, or ethylene/(meth)acrylic acid copolymer may be added as needed to the photosensitive colored composition according to the invention, for providing various properties including alkali-developing efficiency, adhesion, solvent resistance, heat resistance, and the like. The general resin above may be used in an amount of 1 to 50% by weight in the photosensitive colored composition.

The photosensitive colored composition according to the invention further contains a photopolymerization initiator if the composition is cured by irradiation of ultraviolet ray.

Examples of the photopolymerization initiator include acetophenone photopolymerization initiators such as 4-phenoxy-dichloroacetophenone, 4-t-butyl-dichloroacetophenone, diethoxyacetophenone, 1-(4-isopropylphenyl)-2-hydroxy-2-methyl propan-1-one, 1-hydroxycyclohexylphenylketone, and 2-benzyl-2-dimethylamino-1-(4-morpholinophenyl)-butan-1-one; benzoin photopolymerization initiators such as benzoin, benzoin methylether, benzoin ethylether, benzoin isopropylether, and benzyldimethylketal; benzophenone photopolymerization initiators such as benzophenone, benzoylbenzoic acid, benzoylmethyl benzoate, 4-phenyl benzophenone, hydroxybenzophenone, acylated benzophenones, and 4-benzoyl-4'-methyldiphenylsulfide; thioxanthone photopolymerization initiators such as thioxanthone, 2-chlorothioxanthone, 2-methylthioxanthone, isopropylthioxanthone, and 2,4-diisopropylthioxanthone; triazine photopolymerization initiators such as 2,4,6-trichloro-s-triazine, 2-phenyl-4,6-bis(trichloromethyl)-s-triazine, 2-(p-methoxyphenyl)-4,6-bis(trichloromethyl)-s-triazine, 2-(p-tolyl-4,6-bis(trichloromethyl)-s-triazine, 2-piperonyl-4,6-bis(trichloromethyl)-s-triazine, 2,4-bis(trichloromethyl)-6-styryl-s-triazine, 2-(naphto-1-yl)-4,6-bis(trichloromethyl)-s-triazine, 2-(4-methoxynaphto-1-yl)-4,6-bis(trichloromethyl)-s-triazine, 2,4-trichloromethyl-(piperonyl)-6-triazine, and 2,4-trichloromethyl(4'-methoxystyryl)-6-triazine; carbazole photopolymerization initiators; and imidazole photopolymerization initiators. The photopolymerization initiator may be used alone or as a mixture of two or more. The photopolymerization initiator may be used in an amount of 0.5 to 80 parts by weight with respect to 100 parts by weight of monomer.

In addition to the photopolymerization initiator, a sensitizer may also be added. Examples of the sensitizer include α-acyloxy esters, acylphosphine oxides, methylphenyl glyoxylate, benzyl-9,10-phenanthrenequinone, camphorquinone, ethylanthraquinone, 4,4'-diethylisophthalophenone, 3,3'4,4'-tetra(t-butylperoxycarbonyl) benzophenone, 4,4'-diethylaminobenzophenone, and the like. The sensitizer may be used in an amount of 0.1 to 50 parts by weight with respect to 100 parts by weight of photopolymerization initiator.

Further, a solvent such as water or an organic solvent may be added to the photosensitive colored composition according to the invention, for more efficient dispersion of the pigments and more uniform and thinner coating thereof onto a transparent substrate. The organic solvent may be use alone or as a mixture.

The photosensitive colored composition according to the invention can be produced, for example, by the following methods 1 to 4.

1. A previously prepared pigment composition containing a pigment and a pigment dispersant (a pigment derivative and other pigment dispersants) as needed is added to a monomer and a copolymer resin or an organic solvent or aqueous solution thereof, and the resulting mixture is dispersed. The pigment composition exerts a sufficiently high efficiency even if it is prepared simply by mixing a pigment powder and a pigment dispersant powder. However, the pigment composition exerts far more favorable effects, if they are prepared more precisely mixed, for example, by mechanically mixing in a pulverizer such as a kneader, an attritor, a roll mill, or a super mill; adding a solution containing a pigment dispersant to a dispersion of a pigment in water or an organic solvent and allowing the pigment dispersant to be adsorbed on the pigment surface; dissolving a pigment and a pigment dispersant in a solvent having a strong dissolving power such as sulfuric acid and coprecipitating them with a poor solvent such as water; or the like.

2. The pigment composition may be prepared by adding and dissolving a pigment and a pigment dispersant to be added as needed (a pigment derivative and other pigment dispersants) separately to a monomer and a copolymer resin or an organic or aqueous solution thereof.

3. The pigment composition may be prepared by previously dispersing a pigment and a pigment dispersant (a pigment derivative and other pigment dispersants) separately in a monomer and a copolymer resin or an organic solvent or aqueous solution thereof and then mixing the dispersion. In such a case, the pigment dispersant may be dispersed only in a solvent.

4. The pigment composition may also be prepared by dispersing a pigment in a monomer and a copolymer resin or an organic solvent or aqueous solution thereof and then adding a pigment dispersant.

Dispersion of the pigment and the pigment dispersant in the monomer and the copolymer resin or the organic solvent or aqueous solution thereof may be performed in various dispersion devices including a three-roll mill, a two-roll mill, a sand mill, a kneader, a dissolver, a high-speed mixer, a homomixer, or an attritor. In addition, various surfactants may be added thereto for improvement of dispersion efficiency during dispersion.

Bulky particles of 5 μm or more in size, preferably those of 1 μm or more, and more preferably those of 0.5 μm or more, and dust contaminants in the photosensitive colored composition according to the invention are removed by means of a centrifugal separator, a sintered filter, a membrane filter, or the like.

The color filter according to the present invention may be produced by a method of so-called photolithography, wherein a desired pattern is obtained by coating a photosensitive colored composition according to the invention uniformly on a transparent substrate, exposing the coated layer by irradiation of an active energy ray such as ultraviolet ray or electron beam through a photo mask onto the coated layer, and washing the unexposed portion away with a solvent or an aqueous alkaline solution.

The photosensitive colored composition according to the invention may be coated on a transparent substrate by such an application method as spray coating, spin coating, and roll coating.

A glass plate or a plate made of a resin such as polycarbonate, polymethyl methacrylate, or polyethylene terephthalate may be used as the transparent substrate.

Currently, organic solvents are seldom used for development from the concern on environmental issues, and alkali development is the mainstream practice. An aqueous solution of an inorganic alkali such as sodium carbonate or sodium hydroxide or of an organic alkali such as dimethylbenzylamine or triethanolamine is used as the alkaline developing solution. An antifoaming agent and a surfactant may be added to the alkaline developing solution.

For improving the exposure sensitivity, it is possible, after coating and drying a photosensitive colored composition, to coat, on the coated layer, a water soluble or aqueous alkali soluble resin, for example, polyvinylalcohol or water-soluble acrylic resin to form a film for prevention of polymerization inhibition by oxygen, and then carry out the exposure.

The present invention will be described in more detail below with reference to Examples. Preparation Examples of the copolymers and the pigment derivatives having a basic group according to the invention, and Examples of the invention will be described. In the following Examples, "%" means "% by weight", and the "part" means "parts by weight". The molecular weight of copolymers is a weight-average molecular weight in terms of polystyrene, determined by gel-permeation chromatography (GPC).

PREPARATION EXAMPLES OF COPOLYMERS

Preparation Example 1

70.0 parts of cyclohaxanone was placed in a four-necked separable flask equipped with a thermometer, a condenser, a nitrogen gas inlet, a dropping funnel and an agitator. After the flask was heated to 80° C. and purged with nitrogen, a mixture of 13.3 parts of n-butyl methacrylate, 4.6 parts of 2-hydroxyethyl methacrylate, 4.3 parts of methacrylic acid, 7.4 parts of p-cumylphenol ethylene oxide-modified acrylate (Aronix M110, manufactured by Toagosei Co., Ltd.) and 0.4 part of 2,2'-azobisisobutylonitrile was added dropwise from the dropping funnel over 2 hours. After dropwise addition, the mixture was allowed to react additionally for 3 hours, to give a desirable solution of copolymer (1) with a solid content of 30%. The weight-average molecular weight of the copolymer (1) was 26,000.

Preparation Example 2

70.0 parts of cyclohaxanone was placed in a four-necked separable flask equipped with a thermometer, a condenser, a nitrogen gas inlet, a dropping funnel, and an agitator. After the flask was heated to 80° C. and purged with nitrogen, a mixture of 13.3 parts of n-butyl methacrylate, 4.6 parts of 2-hydroxyethyl methacrylate, 4.3 parts of methacrylic acid, 7.4 parts of nonylphenyloxy polyethylene glycol acrylate (Aronix M111, manufactured by Toagosei Co., Ltd.) and 0.4 part of 2,2'-azobisisobutylonitrile was added dropwise from the dropping funnel over 2 hours. After dropwise addition, the mixture was allowed to react additionally for 3 hours, to give a desirable solution of copolymer (2) with a solid content of 30%. The weight-average molecular weight of the copolymer (2) was 28,000.

Preparation Example 3

70.0 parts of cyclohaxanone was placed in a four-necked separable flask equipped with a thermometer, a condenser, a nitrogen gas inlet, a dropping funnel, and an agitator. After the flask was heated to 80° C. and purged with nitrogen, a mixture of 13.3 parts of n-butyl methacrylate, 4.6 parts of 2-hydroxyethyl methacrylate, 4.3 parts of methacrylic acid, 7.4 parts of nonylphenoxy polypropylene glycol acrylate (Aronix M117, manufactured by Toagosei Co., Ltd.) and 0.4 part of 2,2'-azobisisobutylonitrile was added dropwise from the dropping funnel over 2 hours. After dropwise addition, the mixture was allowed to react additionally for 3 hours, to give a desirable solution of copolymer (3) with a solid content of 30%. The weight-average molecular weight of the copolymer (3) was 22,000.

Preparation Example 4

70.0 parts of cyclohaxanone was placed in a four-necked separable flask equipped with a thermometer, a condenser, a nitrogen gas inlet, a dropping funnel, and an agitator. After the flask was heated to 80° C. and purged with nitrogen, a mixture of 13.3 parts of n-butyl methacrylate, 4.6 parts of 2-hydroxyethyl methacrylate, 4.3 parts of methacrylic acid, 7.4 parts of phenoxydiethylene glycol acrylate (Aronix M101, manufactured by Toagosei Co., Ltd.) and 0.4 part of 2,2'-azobisisobutylonitrile was added dropwise from the dropping funnel over 2 hours. After dropwise addition, the mixture was allowed to react additionally for 3 hours, to give a desirable solution of copolymer (4) with a solid content of 30%. The weight-average molecular weight of the copolymer (4) was 26,000.

Preparation Example 5

70.0 parts of cyclohaxanone was placed in a four-necked separable flask equipped with a thermometer, a condenser, a nitrogen gas inlet, a dropping funnel, and an agitator. After the flask was heated to 80° C. and purged with nitrogen, a mixture of 14.1 parts of n-butyl methacrylate, 4.0 parts of 2-hydroxyethyl methacrylate, 3.9 parts of methacrylic acid, 7.4 parts of p-cumylphenol ethylene oxide-modified acrylate (Aronix M110, manufactured by Toagosei Co., Ltd.) and 0.3 part of 2,2'-azobisisobutylonitrile was added dropwise from the dropping funnel over 2 hours. After dropwise addition, the mixture was allowed to react additionally for 3 hours, to give a desirable solution of copolymer (5) with a solid content of 30%. The weight-average molecular weight of the copolymer (5) was 30,000.

Preparation Example 6 (Comparative Example 1)

70.0 parts of cyclohaxanone was placed in a four-necked separable flask equipped with a thermometer, a condenser, a nitrogen gas inlet, a dropping funnel, and agitator. After the flask was heated to 80° C. and purged with nitrogen, a mixture of 17.7 parts of n-butyl methacrylate, 6.1 parts of 2-hydroxyethyl methacrylate, 5.8 parts of methacrylic acid, and 0.4 part of 2,2'-azobisisobutylonitrile was added dropwise from the dropping funnel over 2 hours. After dropwise addition, the mixture was allowed to react additionally for 3 hours, to give a desirable solution of copolymer (6) with a solid content of 30%. The weight-average molecular weight of the copolymer (6) was 27,000.

Preparation Example 7 (Comparative Example 2)

70.0 parts of cyclohaxanone was placed in a four-necked separable flask equipped with a thermometer, a condenser, a nitrogen gas inlet, a dropping funnel, and an agitator. After the flask was heated to 80° C. and purged with nitrogen, a mixture of 21.5 parts of n-butyl methacrylate, 4.0 parts of 2-hydroxyethyl methacrylate, 3.9 parts of methacrylic acid, 0.3 part of acid phosphoxyethyl methacrylate (Phosmer M, manufactured by Nippon Kayaku) and 0.3 part of 2,2'-azobisisobutylonitrile was added dropwise from the dropping funnel over 2 hours. After dropwise addition, the mixture was allowed to react additionally for 3 hours, to give a desirable solution of copolymer (7) with a solid content of 30%. The weight-average molecular weight of the copolymer (7) was 31,000.

<Preparation of Pigment Derivatives Having a Basic Group>

Preparation Example 8

50 Parts of copper phthalocyanine, a dyestuff component, was chlorosulfonated and then allowed to react with 14 parts of N,N-dimethylaminopropylamine, an amine component, to give 62 parts of a pigment derivative (1) having the following structure.

Pigment Derivative (1):

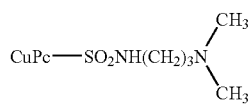

where CuPc represents a copper phthalocyanine residue.

Preparation Example 9

50 Parts of copper phthalocyanine, a dyestuff component, was chloromethylated and then allowed to react with 40 parts of N,N-dibutylamine, an amine component, to give 95 parts of a pigment derivative (2) having the following structure.

Pigment Derivative (2):

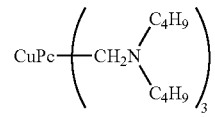

where CuPc represents a copper phthalocyanine residue.

Preparation Example 10

A pigment derivative (3) having the following structure was obtained in a similar manner to Preparation Example 8, by using diphenyldiketopyrrolopyrrole as the dyestuff component and N-aminopropylmorpholine as the amine component.

Pigment Derivative (3):

Preparation Example 11

A pigment derivative (4) having the following structure was obtained in a similar manner to Preparation Example 8, by using dioxazine violet (pigment Violet 23) as the dyestuff component and a compound represented by the following Formula (11) as the amine component.

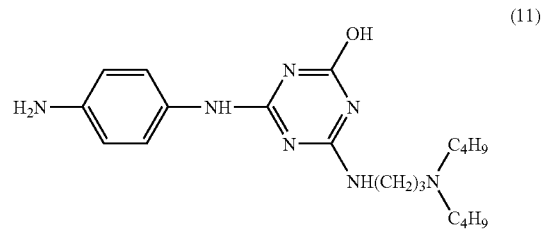

(11)

Pigment Derivative (4):

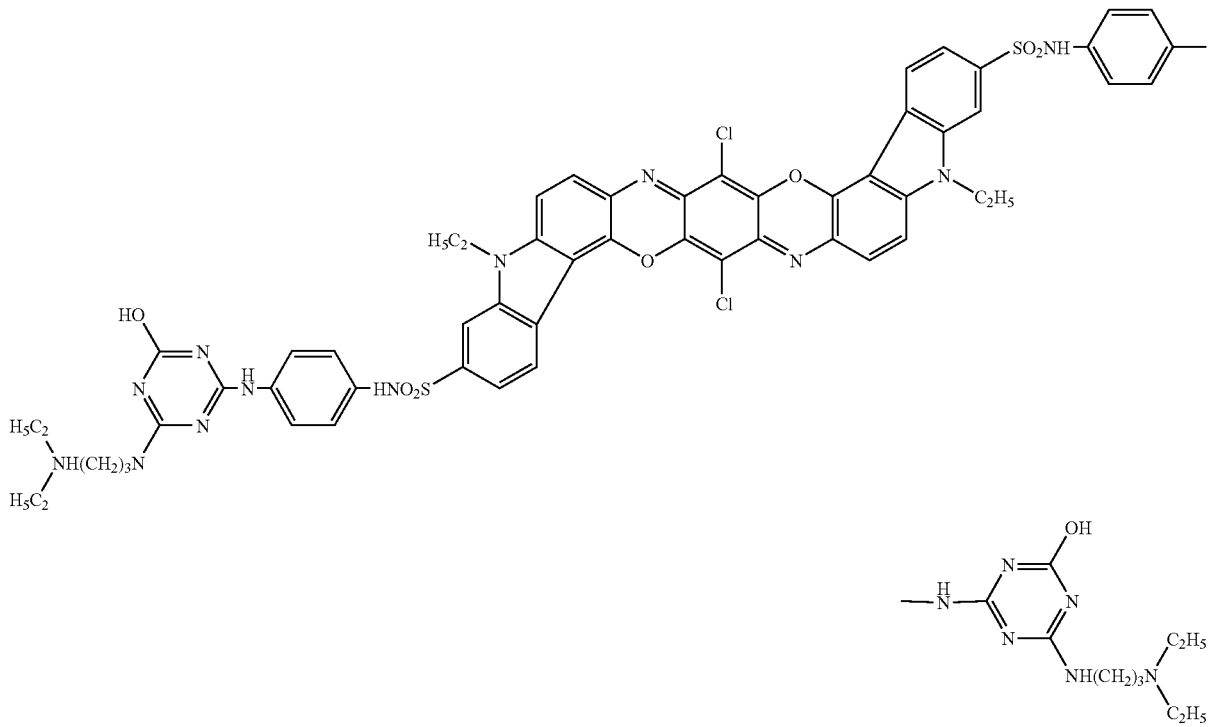

Preparation Example 12

50 Parts of diaminodianthraquinone (Pigment Red 177), a dyestuff component, was allowed to react with 42 parts of cyanuric chloride and 28 parts of N,N-dimethylaminopropylamine forming an amine component, to give 108 parts of a pigment derivative (5) having the following structure.

Pigment Derivative (5):

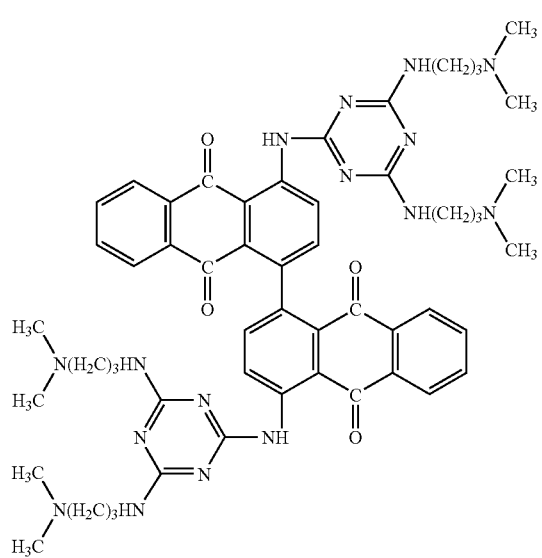

Preparation Example 13

50 Parts of a diazo component having an amine component represented the following formula (12) was allowed to react with 30 parts of 5-acetoacetylaminobenzimidazolone, a coupler component, in a diazo coupling reaction, to give 79 parts of a pigment derivative (6) having the following structure.

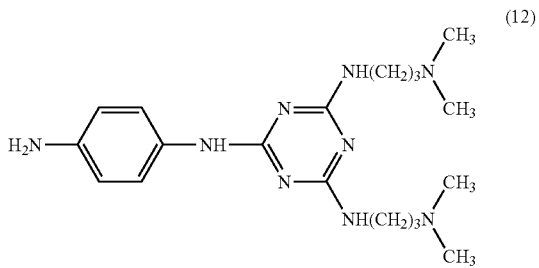

Pigment Derivative (6):

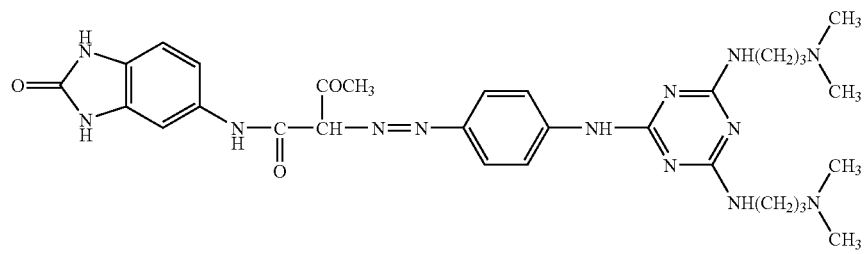

Various pigment derivatives for use in the invention can be prepared in a similar manner to Preparation Examples 8 to 13, by allowing a dyestuff component, anthraquinone or triazine, to react with an amine component or allowing a compound having an amine component to react with a coupler component in a coupling reaction forming a dyestuff.

Examples 1 to 10 and Comparative Examples 1 to 6

<Preparation and Evaluation of Pigment Resists (Photosensitive Colored Compositions)>

Dispersions (1) and (2) having the compositions shown in Table 1 were prepared in a planetary ball mill by using zirconia beads. The pigment resists were prepared by blending a mixed solvent (cyclohexanone/propylene glycol monoethylether acetate (weight ratio: 6/4)), a copolymer, a polyfunctional monomer (dipentaerythritol hexaacrylate), a photopolymerization initiator (2-methyl-1-[(4-methylthio) phenyl]-2-morpholinopropane-1-one) and a sensitizer (4,4'-bis(diethylamino)benzophenone) at the rate shown in Table 1 to the mixtures of dispersions (1) and (2) in the examples wherein both these dispersions were used (Examples 1 to 7, Example 10, Comparative examples 1 to 4, Comparative example 6) and to the dispersion (1) in the examples wherein only dispersion (1) was used (Examples 8 to 9, Comparative example 5), and filtering the resulting mixture through a 1-μm filter.

The viscosity of the obtained pigment resists was determined by using an EL-type viscometer (at a temperature of 25° C.). Additionally, color filters were prepared by allowing the pigment resists thus obtained to circulate in a polytetrafluoroethylene tube for 72 hours, spin coating and drying the pigment resists on a 100×100 mm glass substrate, and exposing, developing and post-baking the resulting films, for evaluation of the aggregates generated. The numbers of the aggregates in these color filters thus determined are summarized in Table 1.

TABLE 1

| | Resist composition (%) | | | | | | | |
|---|---|---|---|---|---|---|---|---|
| | Dispersion (1) | | | | Dispersion (2) | | | |
| | Pigment | Pig. deriv. | Copolymer | Mixed solvent | Pigment | Pig. deriv. | Copolymer | Mixed solvent |
| Ex. 1 | 3.80 Pig. Red 254 | 0.40 Pig. deriv. (3) | 9.50 Copolymer (1) | 21.80 | 0.20 Pig. Yellow 139 | 0.01 Pig. deriv. (6) | 0.77 Copolymer (4) | 1.30 |
| Comp. Ex. 1 | 3.80 Pig. Red 254 | 0.40 Pig. deriv. (3) | 9.50 Copolymer (6) | 21.80 | 0.20 Pig. Yellow 139 | 0.01 Pig. deriv. (6) | 0.77 Copolymer (6) | 1.30 |
| Ex. 2 | 4.20 Pig. Red 254 | | 9.50 Copolymer (1) | 21.80 | 0.20 Pig. Yellow 139 | 0.01 Pig. deriv. (6) | 0.77 Copolymer (4) | 1.30 |
| Ex. 3 | 4.20 Pig. Red 254 | | 9.50 Copolymer (1) | 21.80 | 0.21 Pig. Yellow 139 | | 0.77 Copolymer (4) | 1.30 |
| Ex. 4 | 3.80 Pig. Red 177 | 0.40 Pig. deriv. (5) | 9.50 Copolymer (4) | 21.80 | 0.20 Pig. Yellow 139 | 0.01 Pig. deriv. (6) | 0.77 Copolymer (4) | 1.30 |
| Comp. Ex. 2 | 3.80 Pig. Red 177 | 0.40 Pig. deriv. (5) | 9.50 Copolymer (6) | 21.80 | 0.20 Pig. Yellow 139 | 0.01 Pig. deriv. (6) | 0.77 Copolymer (6) | 1.30 |
| Ex. 5 | 3.80 Pig. Red 48:3 | 0.40 Pig. deriv. (6) | 9.50 Copolymer (4) | 21.80 | 0.20 Pig. Yellow 139 | 0.01 Pig. deriv. (6) | 0.77 Copolymer (4) | 1.30 |
| Comp. Ex. 3 | 3.80 Pig. Red 48:3 | 0.40 Pig. deriv. (6) | 9.50 Copolymer (7) | 21.80 | 0.20 Pig. Yellow 139 | 0.01 Pig. deriv. (6) | 0.77 Copolymer (6) | 1.30 |
| Ex. 6 | 3.58 Pig. Green 36 | 0.2 Pig. deriv. (2) | 8.39 Copolymer (1) | 13.03 | 1.54 Pig. Yellow 150 | 0.08 Pig. deriv. (6) | 5.39 Copolymer (5) | 9.19 |
| Ex. 7 | 3.58 Pig. Green 36 | 0.2 Pig. deriv. (2) | 8.39 Copolymer (2) | 13.03 | 1.54 Pig. Yellow 150 | 0.08 Pig. deriv. (6) | 5.39 Copolymer (5) | 9.19 |
| Comp. Ex. 4 | 3.58 Pig. Green 36 | 0.2 Pig. deriv. (2) | 8.39 Copolymer (7) | 13.03 | 1.54 Pig. Yellow 150 | 0.08 Pig. deriv. (6) | 5.39 Copolymer (7) | 9.19 |
| Ex. 8 | 4.36 Pig. Blue 15:6 | 0.51 Pig. deriv. (1) | 16.22 Copolymer (1) | 17.82 | | | | |
| Comp. Ex. 5 | 4.36 Pig. Blue 15:6 | 0.51 Pig. deriv. (1) | 16.22 Copolymer(6) | 17.82 | | | | |

TABLE 1-continued

| | | | | | | | | |
|---|---|---|---|---|---|---|---|---|
| Ex. 9 | 4.87 | | 16.22 | 17.82 | | | | |
| | Pig. Blue 15:6 | | Copolymer (1) | | | | | |
| Ex. 10 | 4.14 | 0.48 | 15.41 | 16.93 | 0.22 | 0.03 | 0.81 | 0.89 |
| | Pig. Blue 15:6 | Pig. deriv. (1) | Copolymer(1) | | Pig. Violet 23 | Pig. deriv. (4) | Copolymer(3) | |
| Comp. Ex. 6 | 4.14 | 0.48 | 15.41 | 16.93 | 0.22 | 0.03 | 0.81 | 0.89 |
| | Pig. Blue 15:6 | Pig. deriv. (1) | Copolymer(6) | | Pig. Violet 23 | Pig. deriv. (4) | Copolymer(7) | |

| | Resist composition (%) | | | | | | |
|---|---|---|---|---|---|---|---|
| | Copolymer | Polyfunctional monomer | Photoinitiator | Sensitizer | Mixed Solvent | Viscosity (mPa · s) | Resist aggregates (pieces) |
| Ex. 1 | 8.32 Copolymer (1) | 5.40 | 1.80 | 0.80 | 45.9 | 7.2 | 0 |
| Comp. Ex. 1 | 8.32 Copolymer (6) | 5.40 | 1.80 | 0.80 | 45.9 | 17.6 | 221 |
| Ex. 2 | 8.32 Copolymer (1) | 5.40 | 1.80 | 0.80 | 45.9 | 9.8 | 34 |
| Ex. 3 | 8.32 Copolymer (1) | 5.40 | 1.80 | 0.80 | 45.9 | 11.0 | 41 |
| Ex. 4 | 8.32 Copolymer (1) | 5.40 | 1.80 | 0.80 | 45.9 | 6.7 | 1 |
| Comp. Ex. 2 | 8.32 Copolymer (6) | 5.40 | 1.80 | 0.80 | 45.9 | 12.4 | 126 |
| Ex. 5 | 8.32 Copolymer (1) | 5.40 | 1.80 | 0.80 | 45.9 | 8.1 | 0 |
| Comp. Ex. 3 | 8.32 Copolymer (6) | 5.40 | 1.80 | 0.80 | 45.9 | 19.1 | 324 |
| Ex. 6 | 3.50 Copolymer (1) | 5.00 | 1.70 | 0.70 | 47.7 | 6.5 | 1 |
| Ex. 7 | 3.50 Copolymer (1) | 5.00 | 1.70 | 0.70 | 47.7 | 7.3 | 1 |
| Comp. Ex. 4 | 3.50 Copolymer (6) | 5.00 | 1.70 | 0.70 | 47.7 | 12.2 | 154 |
| Ex. 8 | 1.80 Copolymer (1) | 5.30 | 1.49 | 1.10 | 51.4 | 6.2 | 2 |
| Comp. Ex. 5 | 1.80 Copolymer (6) | 5.30 | 1.49 | 1.10 | 51.4 | 13.4 | 166 |
| Ex. 9 | 1.80 Copolymer (1) | 5.30 | 1.49 | 1.10 | 51.4 | 10.1 | 32 |
| Ex. 10 | 1.80 Copolymer (1) | 5.30 | 1.49 | 1.10 | 51.4 | 8.1 | 0 |
| Comp. Ex. 6 | 1.80 Copolymer (6) | 5.30 | 1.49 | 1.10 | 51.4 | 11.1 | 139 |

It is apparent from the results shown in Table 1 that the photosensitive colored composition according to the invention generates a quite smaller amount of aggregates in piping or the like and has an excellent dispersion stability of pigment.

As described above, the invention provides a photosensitive colored composition superior in the dispersion stability of pigment and thus superior in the fluidity thereof. In addition, use of the photosensitive colored composition allows production of a color resist that is significantly resistant to generation of insoluble aggregates in piping of polytetrafluoroethylene, polypropylene, or the like, in air-operated valves, at the tip of dispensing nozzles or slit dies, or the like. Further, use of the color resist allows production of a color filter containing foreign matters at an extremely smaller amount.

What is claimed is:

1. A color filter comprising a transparent substrate and a colored layer, the colored layer comprising a photocured photosensitive colored composition comprising a resin, a monomer, a colorant and a photopolymerization initiator, wherein the resin is a copolymer resin of at least one compound (a) represented by the following general formula (I) with at least one other compound (b) having an ethylenically unsaturated double bond:

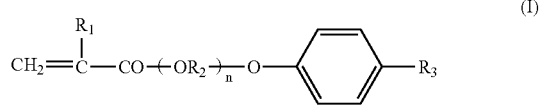

(I)

where $R_1$ represents H or $CH_3$; $R_2$ represents an alkylene group having 2 or 3 carbon atoms; $R_3$ represents a hydrogen atom or an alkyl group having 1 to 20 carbon atoms which may contain a benzene ring; and n is an integer of 1 to 15.

2. The color filter according to claim 1, wherein the compound (b) is at least one compound selected from the group consisting of (meth)acrylic acid and (meth)acrylic acid ester.

3. The color filter according to claim 2, wherein the resin is a copolymer resin of the compound (a), (meth)acrylic acid, and (meth)acrylic acid ester.

4. The color filter according to claim 3, wherein the resin is a copolymer resin containing 10 to 35% by weight of the compound (a), 10 to 55% by weight of (meth)acrylic acid, and 10 to 80% by weight of (meth)acrylic acid ester.

5. The color filter according to claim 1, wherein the compound (a) is p-cumylphenol ethylene oxide or propylene oxide-modified (meth)acrylate.

6. The color filter according to claim 1, wherein the compound (b) is (meth)acrylic acid ester having a phosphate group.

7. The color filter according to claim 1, wherein the resin has an ethylenic double bond on the side chain.

8. The color filter according to claim 1, wherein the copolymer resin the monomer, and the colorant are contained at a weight ratio of 1-50:1-10:1-15.

9. The color filter according to claim 1, further comprising at least one compound selected from a pigment derivative having a basic group, an anthraquinone derivative having a basic group, and a triazine derivative having a basic group.

* * * * *